(12) United States Patent
Liu et al.

(10) Patent No.: US 8,703,392 B2
(45) Date of Patent: Apr. 22, 2014

(54) METHOD AND APPARATUS FOR DEVELOPING PROCESS

(75) Inventors: Yu-Lun Liu, Beidou Township, Changhua County (TW); Chia-Chu Liu, Shin-Chu (TW); Kuei-Shun Chen, Hsin-Chu (TW); Chung-Ming Wang, Chiayi (TW); Ying-Hao Su, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/602,445

(22) Filed: Sep. 4, 2012

(65) Prior Publication Data

US 2014/0065554 A1  Mar. 6, 2014

(51) Int. Cl.
*G03F 7/26* (2006.01)
*B05B 7/00* (2006.01)
*B05C 11/00* (2006.01)

(52) U.S. Cl.
USPC .......... 430/313; 430/325; 430/331; 118/300; 118/666

(58) Field of Classification Search
USPC .................. 430/322, 331; 118/300, 666
See application file for complete search history.

(56) References Cited

U.S. PATENT DOCUMENTS 6,159,662 A * 12/2000 Chen et al. .............. 430/313
2010/0209852 A1 * 8/2010 Yeh et al. ................ 430/311

OTHER PUBLICATIONS

U.S. Patent Office, unpublished U.S. Appl. No. 13/548,557, filed Jul. 13, 2012 entitled "Apparatus and Method for Developing Process," 22 pages.

* cited by examiner

*Primary Examiner* — Cynthia Kelly
*Assistant Examiner* — Caleen Sullivan
(74) *Attorney, Agent, or Firm* — Haynes and Boone, LLP

(57) ABSTRACT

The present disclosure involves a method of fabricating a semiconductor device. The method includes providing a substrate having a material layer formed thereon; depositing a photoresist layer on the material layer, the photoresist layer having a vertical dimension; exposing a region of the photoresist layer to radiation, the exposed region having a horizontal dimension, wherein a first ratio of the vertical dimension to the horizontal dimension exceeds a predetermined ratio; and developing the photoresist layer to remove the exposed region at least in part through applying a developer solution containing a first chemical and a second chemical, wherein: the first chemical is configured to dissolve the exposed region of the photoresist layer through a chemical reaction; the second chemical is configured to enhance flow of the first chemical that comes into contact with the photoresist layer; and an optimized second ratio exists between the first chemical and the second chemical.

20 Claims, 4 Drawing Sheets

US 8,703,392 B2

METHOD AND APPARATUS FOR DEVELOPING PROCESS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, lithography processes often implement exposing and developing processes to pattern small features during IC wafer fabrication and mask fabrication. One of the challenges that arises during the lithography processes is that a bottom scum (footing) is attached to a resist profile. The footing of the resist profile may interfere with an ion implantation process or an etching process, and may further impact the performance of the IC devices.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

Figure 1:
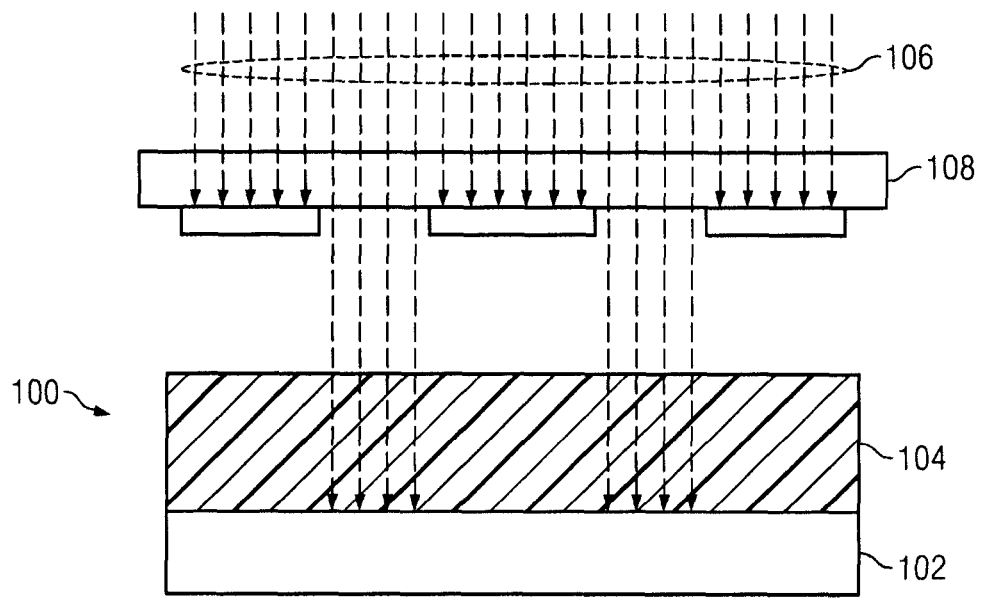
FIGS. 1-4 are cross-sectional side views of a semiconductor device.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
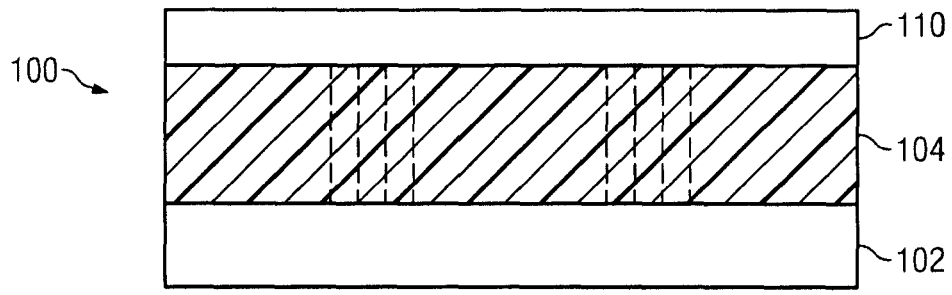
Figure 3:
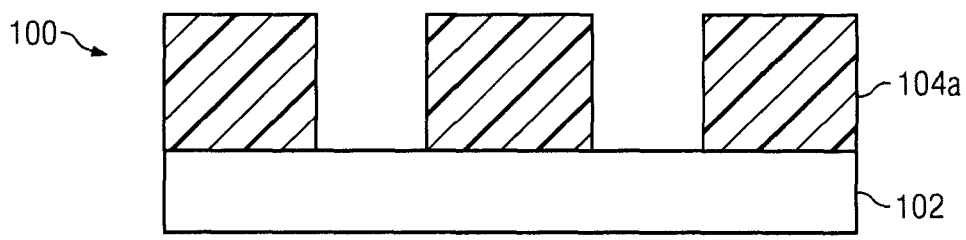

FIGS. 1-3 are diagrammatic cross-sectional side views of forming a resist pattern of a semiconductor device. The resist pattern of the device 100 includes a substrate 102 and a resist film 104. The substrate 102 may include a wafer and a plurality of conductive and non-conductive thin films. The wafer may be a semiconductor substrate including silicon (in other words, a silicon wafer). Alternatively or additionally, the wafer includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative embodiment, the wafer is a semiconductor on insulator (SOI). The plurality of conductive and non-conductive thin films may comprise an insulator or a conductive material. For example, the conductive material comprises a metal such as aluminum (Al), copper (Cu), tungsten (W), nickel (Ni), titanium (Ti), gold (Au), and platinum (Pt) and, thereof an alloy of the metals. The insulator material may include silicon oxide and silicon nitride.

A resist film 104 is deposited over the substrate 102. The resist film 104 may include a positive tone resist or a negative tone resist. The resist film 104 may also include a single resist film or a multiple layer resist film. As shown in FIG. 1, the resist film 104 deposited on the substrate 102 is exposed by an optical exposing tool. Light 106 (i.e., a form of radiation) generated by the optical tool is projected on a mask 108. The light 106 may include I-line light, DUV light, EUV light, or X-ray light. The mask 108 blocks some of the light 106 to transfer an aerial pattern of an IC design layout to the resist film 104. The mask 108 includes a binary mask or a phase shift mask (PSM). The phase shift mask may be an alternative phase shift mask (alt. PSM) or an attenuated phase shift mask (att. PSM). In the present disclosure, a mask is also referred to as a photomask or a reticle.

Some of the light 106 is blocked by the mask 108, and some of the light 106 passes the mask 108 and is projected on the resist film 104, where it reacts with a photo sensitive chemical in the resist film 104 to form a latent image. For example, the photo sensitive chemical is a photo acid generator (PAG) in a DUV resist. The PAG in the resist releases the acid under the radiation of the light 106, and the acid promotes a chemical amplify reaction (CAR), for example, releasing a protection group from the resist in an exposed area during a PEB process. Due to the release of the protection group from the resist, a polarity of the resist in the exposed areas changes from hydrophobic polarity to hydrophilic polarity and a latent pattern is also formed in the exposed resist film.

As shown in FIG. 2, a developer 110 is applied to the exposed resist film 104 deposited on the substrate 102 for developing into a resist pattern. In the depicted embodiment, the final resist pattern depends on the developer tone. For example, if a developer 110 such as tetramethylammonium hydroxide (TMAH) is applied to the exposed resist film 104, the exposed (hydrophilic) portions of the resist film 104 are dissolved by the developer 110 during the developing process, and the unexposed (hydrophobic) portions of the resist film 104 remain to form a patterned resist film 104a, providing the final resist pattern shown in FIG. 3.

However, conventional methods of developing a resist film may have shortcomings, for example a photoresist scum (also referred to as photoresist footing) at a bottom of a photoresist trench. The photoresist scum visually illustrated in FIG. 4, which shows a cross-sectional view of a patterned photoresist layer 120 formed over a patternable layer 103 disposed over a substrate 102. The patterned photoresist layer 120 includes straight up portions 120a and bottom footing portions 120b near the substrate 102. As is shown, the bottom footing portions 120b of the photoresist layer 120 protrude laterally outwards, whereas the straight up portions 120a can keep a relatively straight cross-sectional profile. The laterally-protruding bottom footing portions 120b of the photoresist layer 120 may be referred to as photoresist scum or photoresist footing, which is undesirable since it adversely impacts lithography performance.

A plurality of trenches 130 separates the segments of the patterned photoresist layer 120. These trenches 130 are formed by the removal of the exposed regions of the photoresist layer. An aspect ratio of the trenches 130 may be defined as a ratio of a depth 140 of the trench 130 to a lateral width 145 of the trench 130. The depth 140 of the trench 130 may also be considered the thickness or vertical dimension of the photoresist layer 120, and the width 145 of the trench 130 may also be considered the horizontal dimension of the region of the photoresist layer exposed to radiation.

As semiconductor fabrication technologies continue to advance (for example moving to advanced nodes such as 14-nm or beyond), the fabrication process complexities will increase. More fabrication steps may be utilized in many cases. As a result, the patternable layer 103 underlying the photoresist layer 102 may need to be made thicker (i.e., having a greater vertical dimension than fabrication processes for previous generations). For example, a combined thickness of a hard mask layer and a polysilicon layer may only need to be as thick as 1000 Angstroms for a 28-nm process, but this combined thickness may need to be at least 2000 Angstroms for a 14-nm process. Thus, it may be said that advanced fabrication processes may involve using a patternable layer with a high or tall topography.

Due to the tall topography of the underlying patternable layer, the vertical dimension (i.e., the depth 140) of the photoresist layer 120 may need to increase as well. This is because a thicker resist film may be needed to pattern a correspondingly thicker underlying material layer. Meanwhile, semiconductor feature sizes remain the same or continue to shrink as fabrication technology continues its advance. Therefore, the width 145 (lateral dimension) of the trench 130 may remain the same or will actually shrink, even as its vertical dimension 140 continues to increase. This leads to an increasingly high aspect ratio of (the vertical dimension 140) to (the horizontal dimension 145).

The existing of the photoresist scum 120b is a consequence of the high aspect ratio of the trenches 130. There may be several contributing factors. One factor is that the high aspect ratio of the trenches makes it difficult for a developer solution to come in and out of the trench 130. Since the trenches 130 are deep, some of the developer solution may get trapped near the bottom of the trench. The trapped developer solution may prevent the bottom portions of the photoresist layer 120 from having chemical reactions with fresh developer solutions. The trapped developer solution near the bottom of the trench also means that the portions of the photoresist material that have already gone through the chemical reaction will not easily be rinsed out of the trenches 130, since they are effectively "blocked" by the trapped developer solution. In other words, the chemical reaction between the developer solution and the photoresist material at the bottom of the trenches 120 becomes inefficient and ineffective as the aspect ratio of the trenches 130 becomes greater. This may lead to an incomplete reaction, thereby leaving the photoresist scum 120b near the bottom of the trenches 130.

Other contributing factors to the photoresist scum 120b may include non-uniform exposure of the resist film 104 during the exposing process. For example, during the exposing process, because of light scattering or light reflection, a bottom area of the resist film 104 may be partially exposed by the scattering light or the reflective light. Thus, the partial exposed bottom area may not be dissolved during the developing process. And because of the light scattering and/or reflecting at the bottom of the resist film 104, the resist film 104 receives different energy doses at different portions, and therefore the resist film forms a latent resist profile with different polarity at upper and lower portions of the resist film 104. The different polarity may have different solubility to the same developer, thereby also contributing to the photoresist scum 120b.

Figure 5:
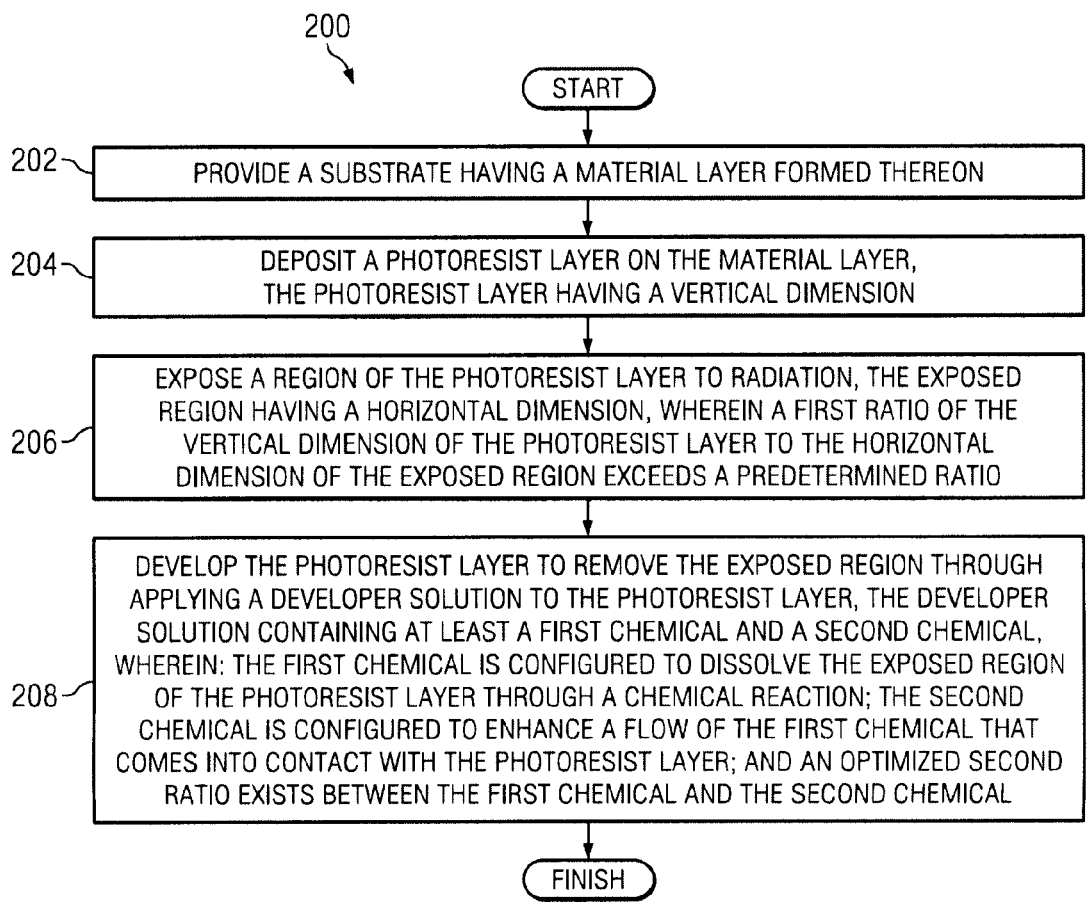
FIG. 5 is a flow chart of a method for performing a lithography process according to one or more embodiments of the present disclosure.

According to various aspects of the present disclosure, an improved lithography method is disclosed that substantially reduces or eliminates the presence of the photoresist scum 120b. Referring to FIG. 5, a flowchart of a method 200 of fabricating a semiconductor device is illustrated according to various aspects of the present disclosure. The method 200 includes an operation 202, in which a substrate is provided. The substrate may be a semiconductor wafer or a mask. The substrate has a material layer formed thereon. The material layer may be a patternable layer, for example a hard mask layer containing a dielectric material, or a semiconductor layer containing a polysilicon material.

The method 200 includes an operation 204, in which a photoresist layer (also referred to as resist film) is deposited over the material layer. The photoresist layer is an example of a patterning layer and may include either positive resist or negative resist. The deposition of the photoresist layer may be accomplished through a spin-on coating process. The photoresist layer has a vertical dimension, which may also be considered to be the thickness or depth of the photoresist layer. In some embodiments, the vertical dimension of the photoresist layer may be in a range from about 500 Angstroms to about 8000 Angstroms.

In certain embodiments, the operation 204 may include performing a dehydration process before applying the resist film on the substrate, which can enhance an adhesion of the resist film to the underlying layers. The dehydration process may include baking the substrate at a high temperature for a specified period of time, or applying a chemical such as hexamethyldisilizane (HMDS) to the substrate. The operation 204 may also include a soft bake (SB), which can increase a mechanical strength of the resist film.

After the operation 204, the method 200 proceeds to an operation 206, in which a region of the photoresist layer is exposed to radiation, so as to form a latent image pattern on the photoresist layer. The exposed region has a horizontal dimension (e.g., a width). A first ratio is defined as a ratio of the vertical dimension of the photoresist layer to the horizontal dimension of the exposed region. The first ratio exceeds a predetermined threshold ratio. In some embodiments, the predetermined threshold ratio is in a range from about 1.5 to about 10, for example about 2.5.

The operation 206 may be performed using an exposing tool. The exposing tool may be an optical exposing tool, such as I-line (365 nm), deep ultraviolet (DUV), extreme ultraviolet (EUV), or X-ray exposing tool. The exposing tool may also be a charged particle tool, such as an electron beam writer. In one embodiment, the deposited resist film is exposed in the DUV exposing tool using a high numerical aperture (NA) lens setting, such as between about 0.75 and 0.90 for improving the resist footing shown in FIG. 4.

The method 200 includes an operation 208, in which the photoresist layer is developed to remove the exposed region. In other words, the removal of the exposed region effectively forms a trench or opening in the photoresist layer. The operation 208 may be performed by applying a developer solution to the photoresist layer. The developer solution contains at least a first chemical and a second chemical. The first chemical is configured to dissolve the exposed region of the photoresist layer through a chemical reaction. The second chemical is configured to enhance a flow of the first chemical that comes into contact with the photoresist layer. In some embodiments, the first chemical includes tetramethylammonium hydroxide (TMAH), and the second chemical includes de-ionized water (DIW). In other words, the developer solution used in the operation 208 may be a diluted TMAH in certain embodiments. The first chemical and the second chemical may be mixed together to generate a fluid mixture that is the developer solution. In some embodiments, they may be mixed together before they are applied to the photoresist in the developing process. In other embodiments, they are individually applied to the photoresist material in the developing process to form a mixture while they are on the wafer.

According to the various aspects of the present disclosure, an optimized second ratio exists between the first chemical and the second chemical. Stated differently, the developer solution herein is not a random mixture of the first chemical and the second chemical (and/or other chemicals). Rather, the developer solution is generated by carefully balancing the amounts of its various chemicals. Hence, the developer solution used to develop the photoresist has an optimized balance between the first and second chemicals, or at least approaching it. The reason for having an optimized balance between the first and second chemicals in the developer solution is discussed below with reference to FIG. 6.

Figure 6:
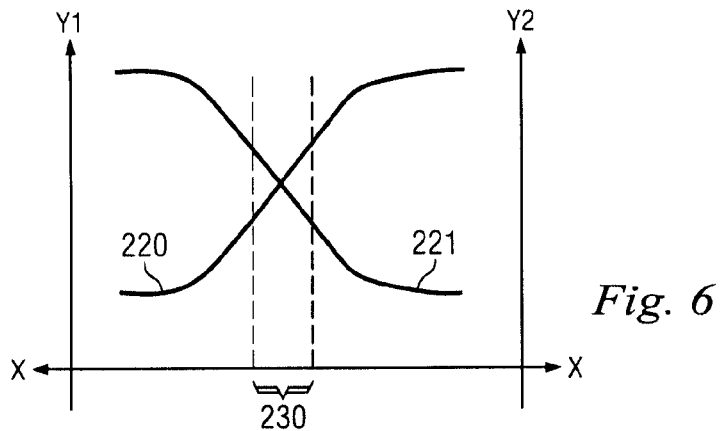
FIG. 6 is a graphical chart illustrating a trade-off analysis in determining the material composition of a developer solution used in the lithography process.

FIG. 6 is a simplified graphical chart that illustrates a trade-off analysis. In more detail, the chart contains a horizontal X-axis, a vertical $Y_1$-axis, and a vertical $Y_2$-axis. The X-axis represents the ratio of the first chemical to the second chemical in the developer solution. The ratio increases corresponding to moving from left to right on the X-axis. In other words, at the left end of the X-axis, the ratio of the first chemical to the second chemical is at a minimum (i.e., the developer solution is made up almost entirely of the second chemical and no first chemical). At the right end of the X-axis, the ratio of the first chemical to the second chemical is at a maximum (i.e., the developer solution is made up almost entirely of the first chemical and no second chemical).

Using TMAH and DIW as the first and second chemicals as an example to illustrate the above point, at the left end of the X-axis, the developer solution contains substantially just DIW but only a negligible amount of TMAH. With the TMAH being considered as a solvent and the DIW being considered a solute of the developer solution, it may be said that the developer solution is extremely diluted at the left end of the X-axis. At the right end of the X-axis, the developer solution contains substantially just TMAH but only a negligible amount of DIW. Once again, with the TMAH being considered as a solvent and the DIW being considered a solute of the developer solution, it may be said that the developer solution is extremely concentrated and almost has zero dilution at the right end of the X-axis. At the middle of the X-axis, the developer solution contains almost equal amounts of TMAH and DIW. Thus, it may be said that the developer solution becomes less diluted and more concentrated as it moves along the X-axis from the left to the right.

The $Y_1$-axis represents the effectiveness of the developer solution in terms of reacting with and dissolving the photoresist material that it comes into contact with. Since the first chemical of the developer solution is configured to carry out the above task, it may be said that the $Y_1$-axis represents the effectiveness of the first chemical in dissolving photoresist as well. An increase of the effectiveness corresponds with moving up the $Y_1$-axis.

The $Y_2$-axis represents the flow of the first chemical that comes into contact with the photoresist. In other words, the $Y_2$-axis represents how easy (or difficult) it is to purge the first chemical after it has already reacted with the photoresist material. Moving up the $Y_2$-axis indicates that it is relatively easy to purge the reacted first chemical (higher flow rate), and moving down the $Y_2$-axis indicates that it is relatively difficult to purge the reacted first chemical.

The chart of FIG. 6 also shows the plot of two curves 220 and 221. The curve 220 is a plot of $Y_1$ against X, and the curve 221 is a plot of $Y_2$ against X. As the curve 220 shows, when the ratio of the first chemical to the second chemical is heavily tilted in favor of the second chemical, the developer solution is quite diluted and thus is not very effective at reacting with and dissolving the photoresist, as is shown by its low value on the $Y_1$ axis. However, as more and more first chemical is added to the developer solution (represented by an increase of the ratio and a movement to the right on the X-axis), the developer solution becomes more capable at reacting with and dissolving the photoresist, until it approaches a saturation level (i.e., a plateau).

Meanwhile, as the curve 221 shows, when the ratio of the first chemical to the second chemical is heavily tilted in favor of the second chemical, the developer solution—though quite diluted—is actually very capable of being purged. In other words, the first chemical (e.g., TMAH) of the developer solution has a good flow and is not easily trapped at the bottom of the trench (such as the trench 130 of FIG. 4). As the first chemical is constantly purged from the bottom of the trench, this enables fresh developer solution containing fresh first chemical to come in the bottom of the trench and react with and dissolve the photoresist near the bottom of the trench, thereby preventing the formation of the photoresist scum discussed above. However, as more and more first chemical is added to the developer solution (represented by an increase of the ratio and a movement to the right on the X-axis), the developer solution becomes more concentrated, which means it is harder to purge, especially at the bottom of the trench. As a result, as the first chemical concentration in the developer solution increases, the first chemical is more likely to be trapped near the bottom of a trench (especially as the aspect ratio of the trench increases), thereby leading to the formation of photoresist scum.

Based on the above discussions, it is desirable to make a trade-off analysis between the effectiveness rate at which the photoresist is reacted and dissolved and the rate at which the developer solution (in particular the first chemical) is purged. Stated differently, it may be desirable to identify an X-axis range in which both the photoresist dissolving performance and the developer purging performance may be acceptable. For example, in the illustrated embodiment, a range 230 of the X-axis corresponding to a region near an intersection of the curves 220-221 may a result of the trade-off analysis. Because at this range, the developer solution approaches the right mix (or balance or ratio) of the first chemical and the second chemical, such that the developer solution can react with and dissolve the photoresist at a decent rate, while it is still relatively easy to be purged and will not likely to get trapped inside a high aspect ratio trench. This range 230 may be referred to as an optimized range for the ratio (between the first and second chemicals). In some embodiments, a specific point within the range 230 may be determined as an optimized ratio between the first chemical and the second chemical.

It is understood that the optimized ratio (or the optimized ratio range 230) is not necessarily fixed. In fact, depending on the fabrication technologies and demands, the optimized ratio (or the optimized ratio range) may be adjusted, for example by moving to the left or to the right on the X-axis. As an example, as the fabrication technology node continues to shrink, each future generation node may have a corresponding optimized ratio or ratio range. As another example, as the aspect ratio of the trench changes, so may the optimized ratio or range. For instance, as the aspect ratio of the trench becomes higher, the trench is taller, which means the developer solution is more likely to get trapped inside the trench. Therefore, it may be desirable to increase the flow rate or the rate at which the first chemical can be purged from the trench, at the expense of sacrificing the effectiveness of the developer solution at dissolving photoresist. This may be accomplished by decreasing the ratio of the first chemical to the second chemical, for example. Of course, the above approach is merely an example of how the ratio between the first and second chemicals is correlated to (or is a function of) the aspect ratio. In other scenarios, the ratio between the first and second chemicals may be adjusted or calculated differently as a function of the aspect ratio depending on other relevant considerations.

Furthermore, it is understood that the duration of the operation 108 may be adjusted as a function of the ratio between the first and second chemicals. For example, as the ratio between the TMAH V.S. DIW (example first and second chemicals, respectively) decreases (meaning the TMAH is becoming more diluted), the amount of time it takes to develop the photoresist may need to be increased accordingly, and vice versa.

It is also understood that the developer solution may further contain a third chemical that can be used to achieve certain goals. For example, if it is an important consideration to enhance the flow rate of the developer solution, it may be desirable to lower a viscosity of the developer solution, since a less viscous fluid flows more easily. Thus, as an example, the developer solution may contain a third chemical that is configured to lower a viscosity of the first chemical or the viscosity of the developer solution overall.

It is understood that the operation 208 may include a post expose bake (PEB) before applying the developer to the exposed resist film deposited on the substrate, a post develop bake (PDB) after applying the developer solution to the exposed resist film deposited on the substrate, or both. The operation 208 may also include a final rinse process.

Additional operations can be provided before, during, and after the method 200, and some of the operations described can be replaced, eliminated, or moved around for additional embodiments of the method 100. For example, in some embodiments, the operation 208 also includes a post expose bake (PEB) process, a post develop bake (PDB) process, or both. The operation 208 may also include a rinse process.

Figure 7:
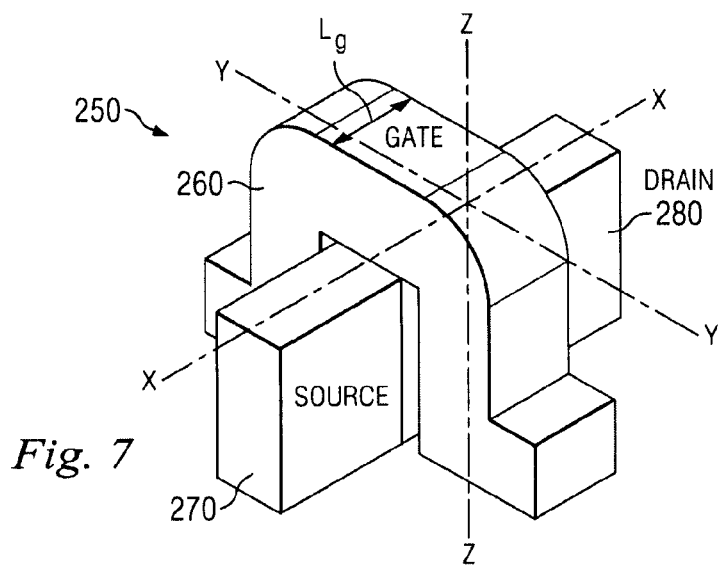
FIG. 7 is a perspective view of an example FinFET device.

It is also understood that the method 200 may apply to advanced processing generations and/or technologies. For example, the method 200 may apply to a 14-nm technology node and beyond. As another example, the method 200 may apply to both planar transistor devices and FinFET devices. In more detail, a perspective view of an example FinFET device 250 is illustrated in FIG. 7. The FinFET device 250 is a non-planar multi-gate transistor that is built on a substrate. A thin silicon "fin-like" structure (referred to as fin) forms the body of the FinFET device 250. A gate 260 of the FinFET device 250 is wrapped around this fin. Lg denotes a length (or width, depending on the perspective) of the gate 260. A source 270 and a drain 280 of the FinFET device 250 are formed in extensions of the fin on opposite sides of the gate 260. The fin itself serves as a channel. The effective channel length of the FinFET device 250 is determined by the dimensions of the fin.

The use of FinFET devices has been gaining popularity in the semiconductor industry due to certain advantages offered over traditional planar Metal-Oxide Semiconductor Field Effect Transistor (MOSFET) devices. These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip. However, the fabrication of FinFET devices may require advanced fabrication process technologies, for example fabrication process technologies that can handle high aspect ratio lithography demands. The method 200 discussed above satisfies these demands associated with the fabrication of FinFETs as well as other planar devices that have stringent lithography requirements.

Figure 8:
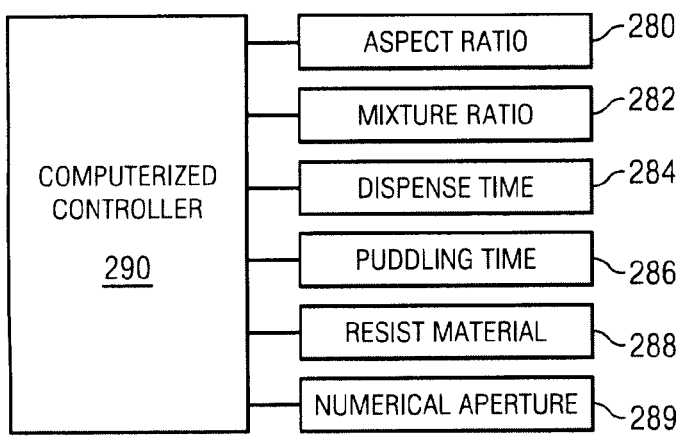
FIG. 8 is a block diagram of a computerized controller and various variables for implementing one or more embodiments of the present disclosure.

Referring now to FIG. 8, there are several variables involved in the above analysis in generating an optimized developer solution. These variables may include aspect ratio 280, a ratio 282 between the first and second chemicals, a time duration 284 of the developing process, a puddling time 286 of the mixture on the resist film, a type of resist material being used 288, and the NA lens setting 289 of the exposure tool. Selection of these variables depends on the resist profile requirement, the resist film, the exposing condition, and the topography of the wafer, as well as a developing recipe to be used on the resist. In some embodiments, a computerized controller 290 is provided to control the variables 280-289. The computer 290 includes a processor, memory, and input/output. The computer 290 can be a separate computer, a built-in computer, or a combination of computers. The variables 280-289 can be inputs, such as part of a recipe, or can be calculated by the computer 290 in response to various conditions, including engineering input, testing feedback, and so forth. For example, increasing the NA of the lens setting above a standard setting (as commonly used for a specific technology node) may lead to a reduction in the resist footing.

After the spin-off process, the first and second chemicals of the developer solution may be dispensed to the exposed resist film again. After the puddling process, the mixture is spinning off by the rotation. The dispensing, puddling and spinning can be repeated for multiple times during the developing process. In the present embodiments, the second chemical, such as DIW, is also used as a final rinse solution.

Figure 9:
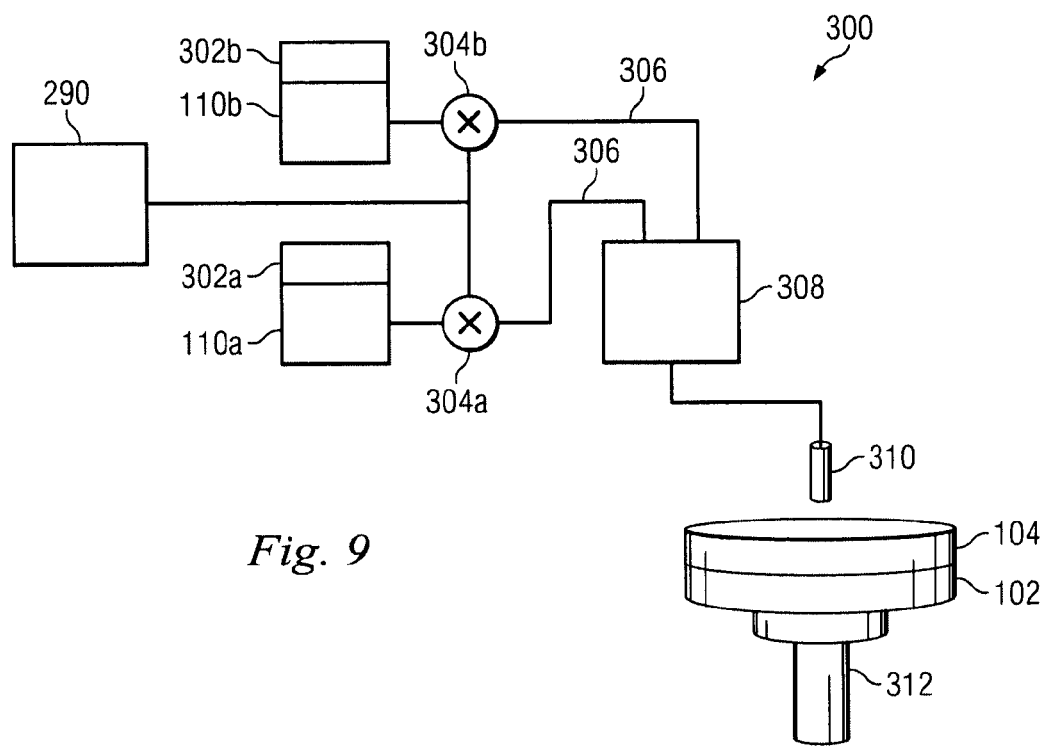
FIG. 9 is a diagram of a developing apparatus for implementing a lithography process according to one or more embodiments of the present disclosure.

Referring now to FIG. 9, a diagram of an apparatus 300 for dispensing the developer solution on a wafer coated with a photoresist material is illustrated according to various aspects of the present disclosure. The apparatus 300 includes tanks 302a and 302b, pumps 304a and 304b, tubing 306, a mixing device 308, a nozzle 310, a chuck 312, and the computerized controller 290. However, other configurations and inclusion or omission of the apparatus may be possible. In the present embodiments, a pump is also referred to as a valve.

The tanks 302a and 302b each store a one of the chemicals of the developer solution. For example, the tank 302a stores the first chemical 110a (e.g., TMAH), and the tank 302b stores the second chemical 110b (e.g., DIW). The tanks 302a and 302b are respectively connected to the pumps 304a and 304b through the tubing 306. The tank 302a is connected to the pump 304a, and the tank 302b is connected to the pump 304b. In the depicted embodiment, the pumps 304a and 304b are connected to the mixing device 308 through the tubing 306. The mixing device 308 is configured to mix the first chemical 110a and the second chemical 110b to form a mixture (e.g., TMAH diluted by DIW).

The mixing device 308 is connected to the nozzle 310 by the tubing 306. The tubing 306 includes any element or combination of elements that facilitate transporting the first chemical 110a and the second chemical 110b from the tanks 302a and 302b to mixing device 308 and transporting the mixture to the nozzle 310. The nozzle 310 is located above the chuck 312. The nozzle 310 sprays the first chemical 110a, the second chemical 110b, or the mixture of the first and second chemicals on the exposed resist film 104 deposited on the substrate 102 secured by the chuck 312. The chuck 312 is used to secure the substrate 102 deposited with the resist film 104 during the developing process.

The computer 290 is connected to the pump 304a and pump 304b. The computerized controller 290 may give instructions to control the flow rate of the first chemical 110a or the second chemical 110b based on the various considerations discussed with reference to the method 200. By controlling the flow rate of the first chemical 110a or the second chemical 110b, the ratio of the first chemical 110a to the second chemical 110b can be tuned or adjusted until it approaches the optimized ratio.

In an example, after the resist film 104 is deposited on the substrate 102, and the resist film 104 is exposed, the exposed resist film 104 is transferred to the chuck 310 of the apparatus 300 for a developing process. First, the first chemical 110a, such as TMAH, is delivered from the tank 302a to the mixing device 308 through the tubing 306 by turning on the pump 304a; and the second chemical 110b, such as DIW, is also delivered from the tank 302b to the mixing device 308 through the tubing 306 by turning on the pump 304b. Then the mixture of TMAH and water is delivered to the nozzle 310, and is sprayed on the exposed resist film 104 for developing the exposed resist film 104. A ratio of the TMAH and DIW in the mixture, for example, 50% TMAH and 50% water, is controlled by a flow rate ratio of the pump 304a to the pump 304b. An amount of the mixture sprayed on the exposed resist film 104 can be controlled by flow time of the pump 304a and the pump 304b. In the present embodiments, for example, the flow time for pumps 304a and 304b is in a range from about 5 seconds to about 15 seconds.

After the amount of the mixture is sprayed on the exposed resist film 104, the pumps 304a and 304b are turned off, and the mixture is allowed to puddle on the exposed resist film 104. After the puddle, the mixture is spun off from the exposed resist film 104. The mixture can be sprayed and puddled on the resist film more than once to obtain the required resist profile. Finally, the pump 304b is turned on, and a rinse solution, for example, water, is sprayed on the exposed resist film 104 through the tubing 306, the mixing device 308 and the nozzle 310 for a final rinse to reduce a resist residue.

Figure 10:
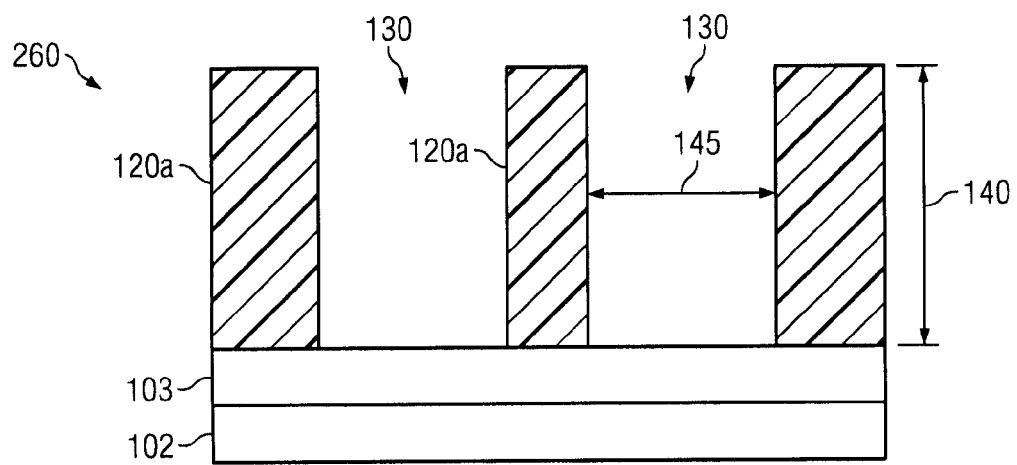
FIG. 10 is a cross-sectional profile of a photoresist material after a developing process has been performed according to one or more embodiments of the present disclosure.

Referring now to FIG. 10, a resist profile 260 is illustrated by using an optimized mixture of the first chemical and the second chemical as a part of the developing process according to one or more embodiments of the present disclosure. During the developing process, the mixture containing the first and second chemicals is applied to the exposed resist film 104 deposited on the substrate 102. For example, in the present embodiments, the first chemical, such as TMAH, and the second chemical, such as DIW, is dispensed to the exposed resist film deposited on the substrate 102 at the same time to form a mixture of TMAH and DIW on the exposed resist film.

Figure 4:
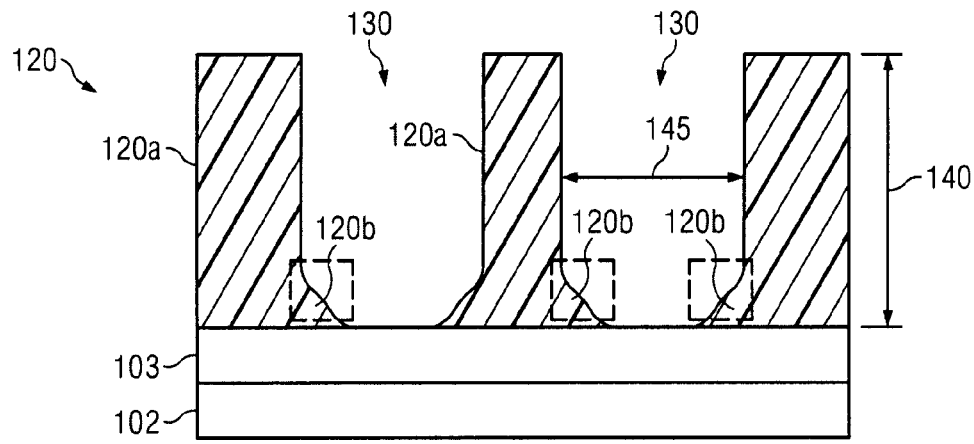

An optimized ratio of TMAH to water is calculated as a function of various factors such as the aspect ratio of the photoresist trench. In some embodiments, the optimized ratio is between about 0.4 and about 0.8, for example between about 0.55 and about 0.65. The optimized ratio between the first and second chemicals may be achieved by controlling the dispensing volume or rate for each of the first and second chemicals. During dispensing the first developer and the second developer, the substrate 102 rotates at spin speed ranging from approximate 800 to 1200 rotation per minute (RPM). The mixture of TMAH and water stays (puddles) on the exposed resist film for a while, such as approximately 5-13 seconds. In the present embodiment, the mixture can puddle while the substrate 102 keeps spinning at a relatively slow rate. Afterwards, the substrate 102 is spun at spin speed ranging from approximate 800 to 1200 RPM, and the mixture of TMAH and DIW spins off by centrifugal force. After the completion of the developing process, the photoresist scum or footing 120b shown in FIG. 4 is reduced or essentially removed, as shown in FIG. 10.

One aspect of the present disclosure involves a method of fabricating a semiconductor device. The method includes: providing a substrate having a material layer formed thereon; depositing a photoresist layer on the material layer, the photoresist layer having a vertical dimension; exposing a region of the photoresist layer to radiation, the exposed region having a horizontal dimension, wherein a first ratio of the vertical dimension of the photoresist layer to the horizontal dimension of the exposed region exceeds a predetermined ratio; and developing the photoresist layer to remove the exposed region at least in part through applying a developer solution to the photoresist layer, the developer solution containing at least a first chemical and a second chemical, wherein: the first chemical is configured to dissolve the exposed region of the photoresist layer through a chemical reaction; the second chemical is configured to enhance a flow of the first chemical that comes into contact with the photoresist layer; and an optimized second ratio exists between the first chemical and the second chemical.

One aspect of the present disclosure involves a method of performing a lithography process. The method includes: providing a substrate having a patternable layer formed thereon; coating a photo-sensitive material over the patternable layer, the photo-sensitive material having a depth; performing a radiation exposure process to the photo-sensitive material; determining an optimal solvent concentration for a developing fluid, wherein the optimal solvent concentration is determined at least in part through a trade-off analysis between: a first rate at which the solvent can react with an exposed portion of the photo-sensitive material, and a second rate at which a reacted solvent can be purged by a solute of the developing fluid; mixing the solvent with the solute to generate the developing fluid having the optimal solvent concentration; and performing a developing process to the photo-sensitive material to form a trench in the exposed portion of the photo-sensitive material, wherein the trench is formed at least in part by applying the developing fluid with the optimal solvent concentration to the exposed portion of the photo-sensitive material, and wherein the trench has an aspect ratio that exceeds a predefined threshold ratio.

One aspect of the present disclosure involves a lithography system, comprising: a first storage mechanism configured to store and dispense a solvent of a developing fluid, the solvent being capable of dissolving a radiation-exposed photoresist material through a chemical reaction; a second storage mechanism configured to store and dispense a solute of the developing fluid, the solute being capable of purging the solvent through a rinse; and a computerized controller coupled to the first and second storage mechanisms, the computerized controller being configured to: determine an optimized ratio between the solvent and the solute of the developing fluid; and instruct the first and storage mechanisms to respectively dispense appropriate amounts of the solvent and solute to a photoresist layer coated on a wafer so that the dispensed solvent and solute approaches the optimized ratio.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   providing a substrate having a material layer formed thereon;
   depositing a photoresist layer on the material layer, the photoresist layer having a vertical dimension;
   exposing a region of the photoresist layer to radiation, the exposed region having a horizontal dimension, wherein a first ratio of the vertical dimension of the photoresist layer to the horizontal dimension of the exposed region exceeds a predetermined ratio; and
   applying a developer solution having a ratio of a first chemical and a second chemical based on the first ratio to avoid a footing being formed in the photoresist layer after applying the developer solution,
   wherein:
      the first chemical is configured to dissolve the exposed region of the photoresist layer through a chemical reaction;
      the second chemical is configured to enhance a flow of the first chemical that comes into contact with the photoresist layer; and
      an optimized second ratio exists between the first chemical and the second chemical.

2. The method of claim 1, further comprising: calculating the optimized second ratio as a function of the first ratio.

3. The method of claim 1, further comprising: adjusting a duration of the developing as a function of the second ratio.

4. The method of claim 1, wherein the developing forms a trench corresponding to a removal of the exposed region in the photoresist layer, and wherein the second chemical is configured to enhance the flow of the first chemical by preventing a trapping of the first chemical near lower portions of the trench.

5. The method of claim 4, wherein the predetermined ratio is an aspect ratio of the trench, and wherein the aspect ratio is about 2.5:1.

6. The method of claim 1, wherein the second chemical is configured to enhance the flow of the first chemical by purging remnants of the first chemical and the photoresist that have already completed the chemical reaction.

7. The method of claim 1, wherein the optimized second ratio is in a range from about 0.4 and about 0.8.

8. The method of claim 1, wherein:
   the first chemical includes tetramethylammonium hydroxide (TMAH); and
   the second chemical includes de-ionized water (DIW).

9. The method of claim 1, wherein the developer solution further contains a third chemical that lowers a viscosity of the first chemical.

10. The method of claim 1, wherein the semiconductor device comprises a FinFET.

11. A method of performing a lithography process, comprising:
   providing a substrate having a patternable layer formed thereon; coating a photo-sensitive material over the patternable layer, the photo-sensitive material having a depth;
   performing a radiation exposure process to the photo-sensitive material to form an exposed region having a width, wherein a ratio of the depth of the photoresist layer to the width of the exposed region represent an aspect ratio of a trench to be formed in the photo-sensitive material; and
   determining an optimal solvent concentration for a developing fluid based on the aspect ratio to avoid a footing being formed in the photoresist layer after performing a developing process to the photo-sensitive material, wherein the optimal solvent concentration is determined at least in part through a trade-off analysis between: a first rate at which the solvent can react with an exposed portion of the photo-sensitive material, and a second rate at which a reacted solvent can be purged by a solute of the developing fluid;
   mixing the solvent with the solute to generate the developing fluid having the optimal solvent concentration; and
   performing the developing process to the photo-sensitive material to form the trench in the exposed portion of the photo-sensitive material, wherein the trench is formed at least in part by applying the developing fluid with the optimal solvent concentration to the exposed portion of the photo-sensitive material, and wherein the trench has an aspect ratio that exceeds a predefined threshold ratio.

12. The method of claim 11, wherein a process duration of the developing process is correlated with the optimal solvent concentration.

13. The method of claim 11, wherein the threshold ratio is about 2.5:1.

14. The method of claim 11, wherein the optimal solvent concentration is in a range from about 0.4 and about 0.8.

15. The method of claim 11, wherein:
   the solvent of the developing fluid contains tetramethylammonium hydroxide (TMAH); and
   the solute of the developing fluid contains de-ionized water (DIW).

16. The method of claim 11, wherein the lithography process is performed to form a FinFET device.

17. The method of claim 11, wherein the optimal solvent concentration is further determined based on an expected time duration of the developing process and an expected puddling time of the developing fluid on the photo-sensitive material.

18. A lithography system, comprising:
   a first storage mechanism configured to store and dispense a solvent of a developing fluid, the solvent being capable of dissolving a radiation-exposed photoresist material through a chemical reaction;

a second storage mechanism configured to store and dispense a solute of the developing fluid, the solute being capable of purging the solvent through a rinse; and a computerized controller coupled to the first and second storage mechanisms, the computerized controller being configured to:

determine an optimized ratio between the solvent and the solute of the developing fluid based on an aspect ratio of a feature to be formed in the radiation-exposed photoresist material to avoid a footing being formed in the radiation-exposed photoresist material after performing a developing process to the radiation-exposed photoresist material; and instruct the first and storage mechanisms to respectively dispense appropriate amounts of the solvent and solute to a photoresist layer coated on a wafer so that the dispensed solvent and solute approaches the optimized ratio.

19. The lithography system of claim 18, wherein:

the solvent of the developing fluid contains tetramethylammonium hydroxide (TMAH); and the solute of the developing fluid contains de-ionized water (DIW).

20. The lithography system of claim 18, wherein the computerized controller is further configured to set an amount of time in which the solvent and the solute are dispensed, wherein the amount of time is a function of the optimized ratio between the solvent and the solute.

* * * * *